(12) United States Patent
Lee et al.

(10) Patent No.: US 12,171,130 B2
(45) Date of Patent: *Dec. 17, 2024

(54) DISPLAY APPARATUS HAVING COLOR CONVERTING LAYERS AND METHOD OF MANUFACTURING THE SAME

(71) Applicant: Samsung Display Co., Ltd., Yongin-si (KR)

(72) Inventors: Ansu Lee, Yongin-si (KR); Sunkwang Kim, Yongin-si (KR); Hyungjin Song, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 4 days.

This patent is subject to a terminal disclaimer.

(21) Appl. No.: 17/957,250

(22) Filed: Sep. 30, 2022

(65) Prior Publication Data

US 2023/0029657 A1 Feb. 2, 2023

Related U.S. Application Data

(63) Continuation of application No. 16/878,003, filed on May 19, 2020, now Pat. No. 11,462,594.

(30) Foreign Application Priority Data

Oct. 29, 2019 (KR) ........................ 10-2019-0135589

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 50/854* (2023.02);
(Continued)

(58) Field of Classification Search
CPC .... H10K 59/38; H10K 50/844; H10K 50/854; H10K 50/865
See application file for complete search history.

(56) References Cited

U.S. PATENT DOCUMENTS 7,985,607 B2 7/2011 Kim et al.
8,330,352 B2 12/2012 Sung et al.
(Continued)

FOREIGN PATENT DOCUMENTS

CN 107728368 2/2018
CN 108346681 7/2018
(Continued)

*Primary Examiner* — Nduka E Ojeh
(74) *Attorney, Agent, or Firm* — KILE PARK REED & HOUTTEMAN PLLC

(57) ABSTRACT

A display apparatus includes a substrate including a display area including a first display device, a second display device, and a third display device. The display apparatus includes a first protection layer disposed on the first, second, and third display devices, a first color conversion layer disposed on the first protection layer corresponding to the first display device and including first quantum dots converting incident light into first light, a second color conversion layer disposed on the first protection layer corresponding to the second display device and including second quantum dots converting incident light into second light, and a third color conversion layer disposed on the first protection layer corresponding to the third display device and including light scattering particles converting incident light into third light.

13 Claims, 14 Drawing Sheets

(51) Int. Cl.
  *H10K 50/854* (2023.01)
  *H10K 50/86* (2023.01)
  *H10K 59/12* (2023.01)
  *H10K 71/00* (2023.01)
(52) U.S. Cl.
  CPC ........... *H10K 50/865* (2023.02); *H10K 59/12* (2023.02); *H10K 71/00* (2023.02); *H10K 59/1201* (2023.02)

(56) References Cited

U.S. PATENT DOCUMENTS

| | | | |
|---|---|---|---|
| 9,786,721 B1* | 10/2017 | Tang | .................. H10K 50/8445 |
| 10,185,066 B2 | 1/2019 | Chae et al. | |
| 10,373,978 B2 | 8/2019 | Lee et al. | |
| 10,833,130 B2 | 11/2020 | Ishizuya et al. | |
| 10,948,789 B2 | 3/2021 | Park et al. | |
| 11,462,594 B2* | 10/2022 | Lee | ....................... H10K 71/00 |
| 2007/0200492 A1 | 8/2007 | Cok et al. | |
| 2010/0219429 A1* | 9/2010 | Cok | ..................... H10K 50/865 257/89 |
| 2016/0079564 A1* | 3/2016 | Shim | ..................... H10K 59/122 257/40 |
| 2017/0005119 A1* | 1/2017 | Kang | ................. G02F 1/136209 |
| 2018/0211979 A1* | 7/2018 | Lee | ..................... H01L 27/1218 |
| 2019/0157354 A1 | 5/2019 | Lee et al. | |
| 2019/0165052 A1* | 5/2019 | Son | ..................... G02B 27/0172 |
| 2019/0165055 A1 | 5/2019 | Choi et al. | |

FOREIGN PATENT DOCUMENTS

| | | |
|---|---|---|
| CN | 108628030 | 10/2018 |
| CN | 110349995 | 10/2019 |
| KR | 10-2013-0084506 | 7/2013 |
| KR | 10-1462652 | 11/2014 |
| KR | 10-1479994 | 1/2015 |
| KR | 10-2019-0058130 | 5/2019 |

* cited by examiner

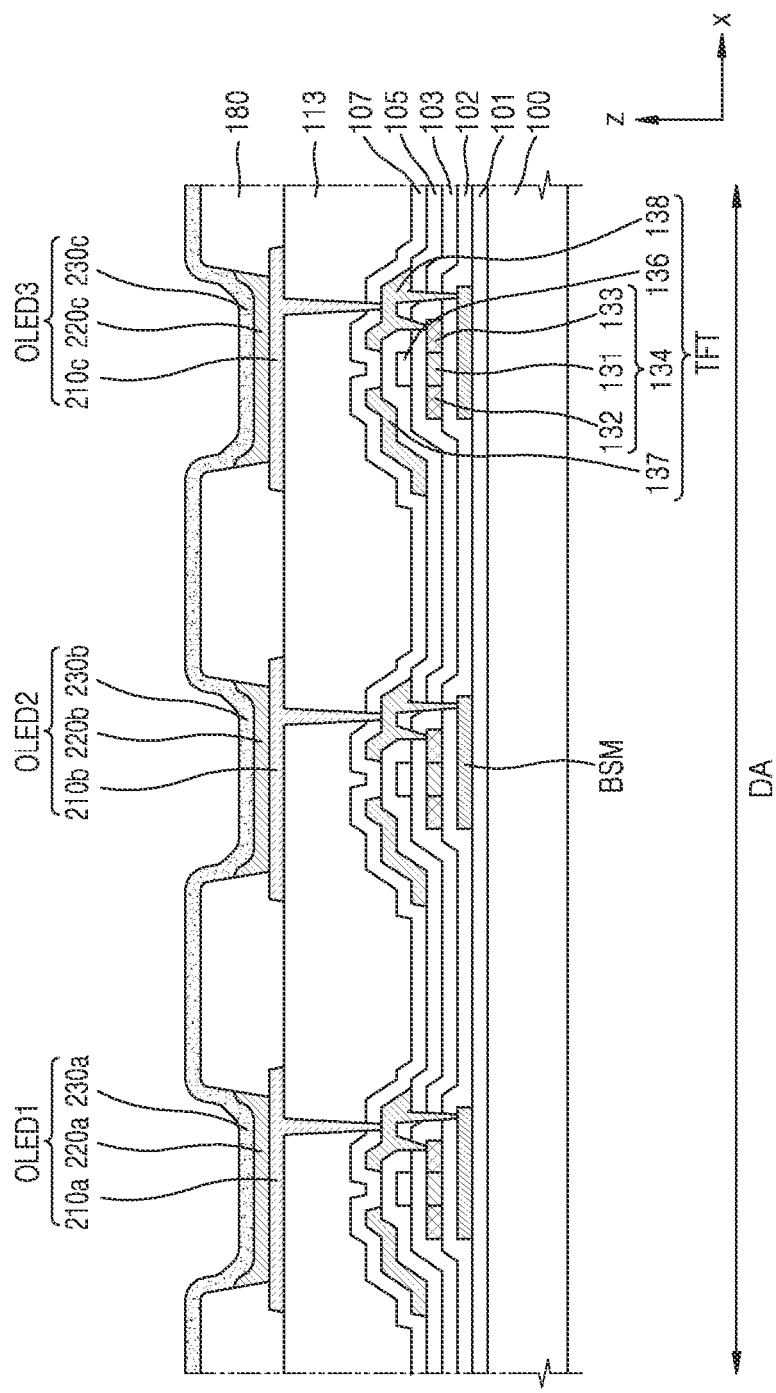

DISPLAY APPARATUS HAVING COLOR CONVERTING LAYERS AND METHOD OF MANUFACTURING THE SAME

CROSS-REFERENCE TO RELATED APPLICATION(S)

This is a continuation application based on currently pending U.S. patent application Ser. No. 16/878,003, filed May 19, 2020, now U.S. Pat. No. 11,462,594 issued on Oct. 4, 2022. the disclosure of which is incorporated herein by reference in its entirety. U.S. patent application Ser. No. 16/878,003 claims priority to and benefit of Korean Patent Application No. 10-2019-0135589 under 35 U.S.C. § 119, filed on Oct. 29, 2019 in the Korean Intellectual Property Office, the entire contents of which are incorporated herein by reference.

BACKGROUND

1. Technical Field

Embodiments relate to a display apparatus and a method of manufacturing the same, and more particularly, to a display apparatus with improved light efficiency and a method of manufacturing the same.

2. Description of the Related Art

Display apparatuses are used for visually displaying data, and accordingly, have been recently used for various purposes in different fields.

As the use of display apparatuses has been diversified, various research has been conducted to improve the quality of the display apparatuses. Particularly, research has been actively conducted to improve the color reproducibility of the display apparatuses according to the trend of manufacturing display apparatuses of higher resolution. Recently, display apparatuses with improved light efficiency and color reproducibility have been provided by using a color conversion material including quantum dots.

SUMMARY

Embodiments include a display apparatus having improved light extraction efficiency and clear emission of colors from respective pixels. However, these problems are merely examples, and the scope of the disclosure is not limited thereto.

Additional aspects will be set forth in part in the description which follows and, in part, will be apparent from the description, or may be learned by practice of the embodiments.

According to embodiments of the invention, a display apparatus may include a substrate, a first protection layer, a first color conversion layer, a second color conversion layer, and a third color conversion layer. The substrate may include a display area and a non-display area. The display area may include a first pixel including a first display device, a second pixel including a second display device, and a third pixel including a third display device. The non-display area may be disposed adjacent to the display area. The first protection layer may be disposed on the first display device, the second display device, and the third display device. The first color conversion layer may be disposed on the first protection layer corresponding to the first display device and may include first quantum dots converting incident light into first light. The second color conversion layer may be disposed on the first protection layer corresponding to the second display device and may include second quantum dots converting incident light into second light. The third color conversion layer may be disposed on the first protection layer corresponding to the third display device and may include light scattering particles converting incident light into third light by scattering the incident light. The first light, the second light, and the third light may have different colors.

In the embodiments, the first color conversion layer, the second color conversion layer, and the third color conversion layer may be directly disposed on the first protection layer.

In the embodiments, the first protection layer may include an inorganic material.

In the embodiments, the display apparatus may further include a first color filter disposed on the first color conversion layer and selectively transmitting the first light, a second color filter disposed on the second color conversion layer and selectively transmitting the second light, and a third color filter disposed on the third color conversion layer and selectively transmitting the third light.

In the embodiments, the display apparatus may further include a barrier disposed between the first color conversion layer and the second color conversion layer and disposed between the second color conversion layer and the third color conversion layer.

In the embodiments, the barrier may include an organic material.

In the embodiments, the display apparatus may further include a light blocking member disposed on the barrier, wherein the light blocking member and the third color filter may include a same material.

In the embodiments, the display apparatus may further include a second protection layer disposed on the first color filter, the second color filter, and the third color filter.

In the embodiments, the second protection layer may include an inorganic material.

In the embodiments, the display apparatus may further include a thin film encapsulation layer disposed on the second protection layer, and the thin film encapsulation layer may include at least one inorganic encapsulation layer and at least one organic encapsulation layer.

In the embodiments, the thin film encapsulation layer may be directly disposed on the second protection layer.

In the embodiments, the first display device, the second display device, and the third display device may each emit blue light.

In the embodiments, the display apparatus may further include a first dam portion disposed on the non-display area adjacent to a periphery of the display area, and a second dam portion spaced apart from the first dam portion and disposed adjacent to the periphery of the display area.

According to one or more embodiments, a method of manufacturing a display apparatus may include forming a first display device, a second display device, and a third display device on a substrate; forming a first protection layer on the first display device, the second display device, and the third display device; forming a barrier on the first protection layer, the barrier exposing a part of the first protection layer, which corresponds to the first display device, the second display device, and the third display device; forming a first color conversion layer on the first protection layer corresponding to the first display device, the first color conversion layer including first quantum dots converting incident light into first light; forming a second color conversion layer on the first protection layer corresponding to the second display device, the second color conversion layer including second quantum dots converting incident light into second light; and forming a third color conversion layer on the first protection layer corresponding to the third display device, the third color conversion layer including light scattering particles converting incident light into third light. The first light, the second light, and the third light may have different colors.

In the embodiments, the first color conversion layer, the second color conversion layer, and the third color conversion layer may be directly formed on the first protection layer.

In the embodiments, the method may further include, after the forming of the first color conversion layer, the second color conversion layer, and the third color conversion layer, forming a first color filter on the first color conversion layer, the first color filter selectively transmitting the first light, and forming a second color filter on the second color conversion layer, the second color filter selectively transmitting the second light.

In the embodiments, the method may further include, after the forming of the first color filter and the second color filter, forming a third color filter on the third color conversion layer, the third color filter selectively transmitting the third light.

In the embodiments, the method may further include, after the forming of the third color filter, forming a second protection layer on the first color filter, the second color filter, and the third color filter.

In the embodiments, the first protection layer and the second protection layer may each include an inorganic material.

In the embodiments, the first display device, the second display device, and the third display device may each emit blue light.

Other aspects, features, and advantages other than those described above will become apparent from the following detailed description, the appended claims, and the accompanying drawings.

BRIEF DESCRIPTION OF THE DRAWINGS

The above and other aspects, features, and advantages of the embodiments will be more apparent from the following description taken in conjunction with the accompanying drawings, in which:

FIGS. 7A to 7G are schematic cross-sectional views illustrating a portion of a process of manufacturing a display apparatus.

DETAILED DESCRIPTION OF THE EMBODIMENTS

Figure 1:
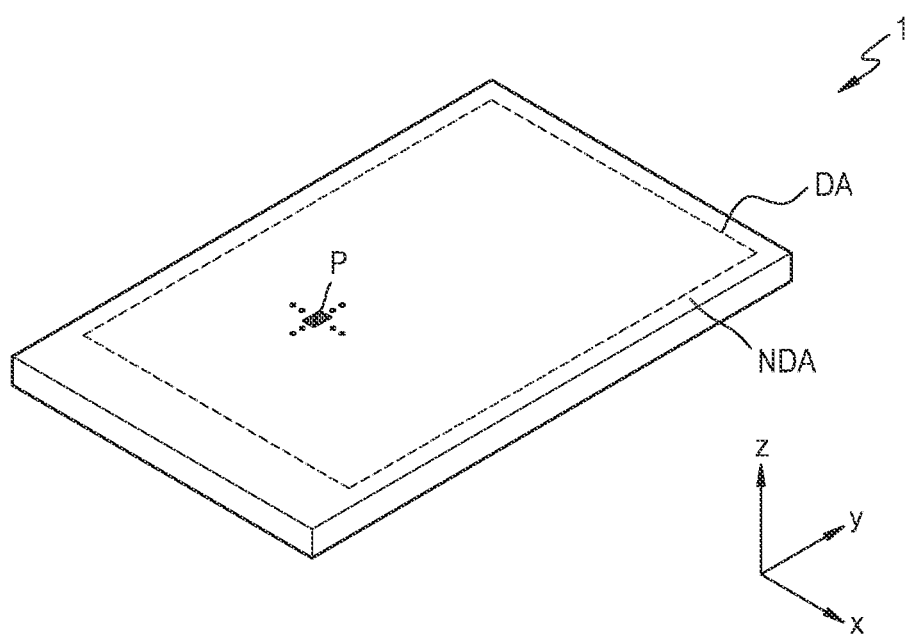
FIG. 1 is a perspective view illustrating a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below by referring to the figures, to explain aspects of the description.

As used herein, the term "and/or" includes any and all combinations of one or more of the associated listed items. Throughout the disclosure, the expression "at least one of a, b, or c" may indicate only a, only b, only c, both a and b, both a and c, both b and c, all of a, b, and c, or variations thereof.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

Hereinafter, embodiments will be described in detail with reference to the accompanying drawings, and in the following description, like reference numerals will denote like elements and redundant descriptions thereof will be omitted.

It will be understood that although terms such as "first" and "second" may be used herein to describe various components, these components should not be limited by these terms and these terms are only used to distinguish one component from another component. Also, as used herein, the singular forms "a," "an," and "the" are intended to include the plural forms as well, unless the context clearly indicates otherwise.

It will be understood that the terms "comprise," "include," and "have" used herein specify the presence of stated features or components, but do not preclude the presence or addition of one or more other features or components.

It will be understood that when a layer, region, or component is referred to as being "located on," "arranged on," "disposed on," or "formed on," another layer, region, or component, it may be "directly" or "indirectly" located on the other layer, region, or component. For example, one or more intervening layers, regions, or components may be located therebetween.

Sizes of components in the drawings may be exaggerated for convenience of description. In other words, because the sizes and thicknesses of components in the drawings are arbitrarily illustrated for convenience of description, the disclosure is not limited thereto.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

When a certain embodiment may be implemented differently, a particular process order may be performed differently from the described order. For example, two consecutively described processes may be performed substantially at the same time or performed in an order opposite to the described order.

FIG. 1 is a perspective view illustrating a display apparatus according to an embodiment.

Referring to FIG. 1, a display apparatus 1 may include a display area DA and a non-display area NDA adjacent to the display area DA. The non-display area NDA may be arranged (or disposed) around the display area DA. The non-display area NDA may surround the display area DA. The display apparatus 1 may provide an image by using light emitted from pixels P arranged (or disposed) in the display area DA, and the non-display area NDA may be an area where no image is displayed. The pixels P may be one of a first pixel P1 (see FIG. 2), a second pixel P2 (see FIG. 2), and a third pixel P3 (see FIG. 2), which will be described below.

Hereinafter, although an organic light emitting display apparatus is described as an example of the display apparatus 1 according to an embodiment, the display apparatus of the disclosure is not limited thereto. In an embodiment, the display apparatus 1 of the disclosure may be an inorganic light emitting display apparatus (or an inorganic electroluminescence (EL) display apparatus) or may be a display apparatus such as a quantum dot light emitting display apparatus. For example, an emission layer of a display element included in the display apparatus 1 may include an organic material, may include an inorganic material, may include quantum dots, may include an organic material and quantum dots, or may include an inorganic material and quantum dots.

Although FIG. 1 illustrates the display apparatus 1 having a flat display surface, the disclosure is not limited thereto. In an embodiment, the display apparatus 1 may include a three-dimensional display surface or a curved display surface.

When the display apparatus 1 includes a three-dimensional display surface, the display apparatus 1 may include display areas indicating different directions and may include, for example, a polygonal columnar display surface. In an embodiment, when the display apparatus 1 includes a curved display surface, the display apparatus 1 may be implemented in various forms such as flexible, foldable, and rollable display apparatuses.

FIG. 1 illustrates the display apparatus 1 that may be applied to a mobile phone terminal. Although not illustrated, a mobile phone terminal may be constructed by arranging electronic modules, a camera module, a power module, and the like mounted on a main board, together with the display apparatus 1 in a bracket/case or the like. The display apparatus 1 according to the disclosure may be applied to large electronic apparatuses such as televisions or monitors and small and medium electronic apparatuses such as tablets, car navigations, game machines, or smart watches.

Although FIG. 1 illustrates an embodiment where the display area DA of the display apparatus 1 is tetragonal, the shape of the display area DA may also be circular, elliptical, or polygonal such as triangular or pentagonal.

Figure 2:
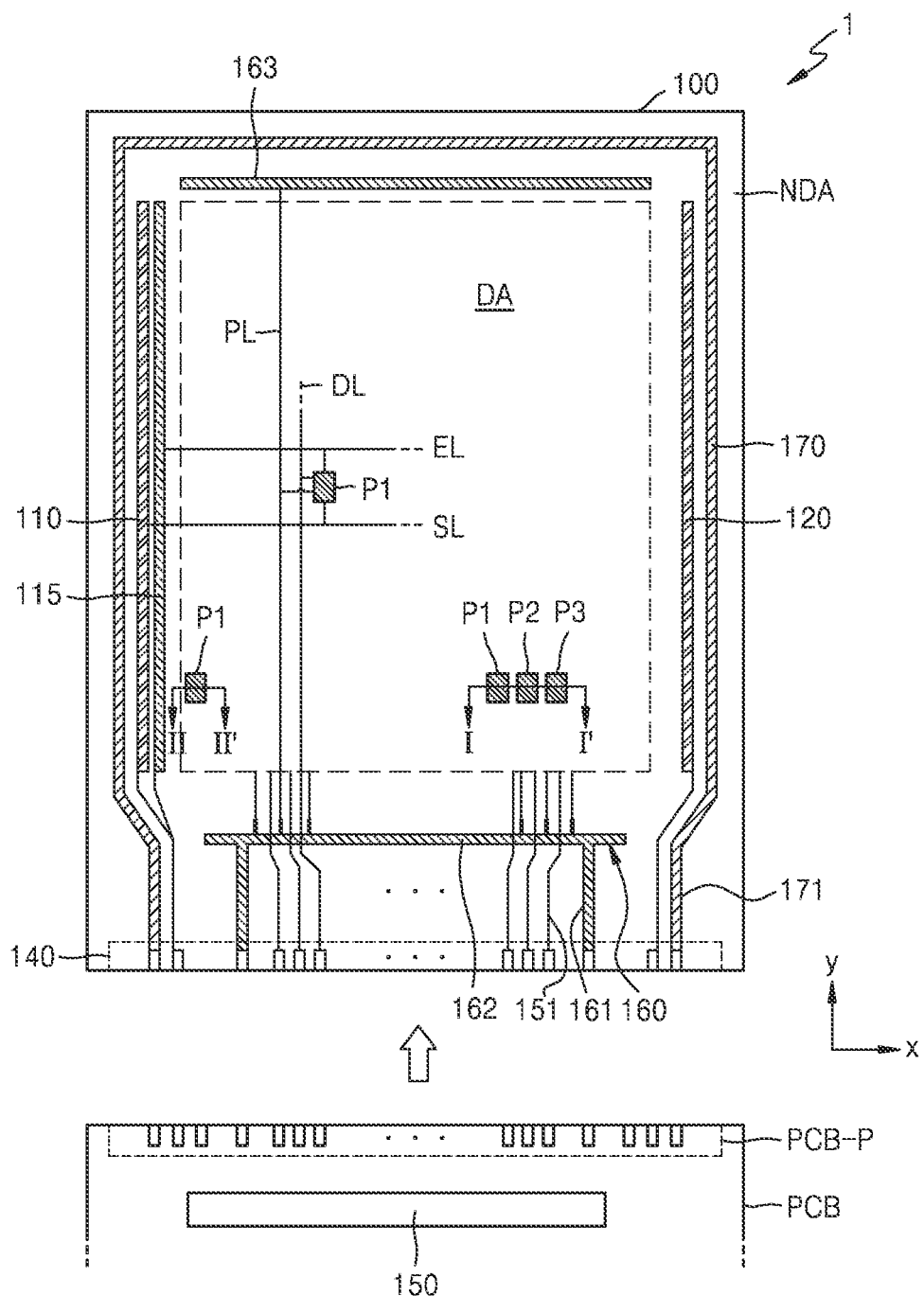
FIG. 2 is a plan view schematically illustrating a display apparatus according to an embodiment.

FIG. 2 is a plan view schematically illustrating a portion of a display apparatus according to an embodiment.

Referring to FIG. 2, a display apparatus 1 may include pixels P arranged (or disposed) in a display area DA. The pixels P arranged (or disposed) in the display area DA may be, for example, one of a first pixel P1, a second pixel P2, and a third pixel P3. The first pixel P1, the second pixel P2, and the third pixel P3 may each include a display device such as an organic light emitting diode OLED. The first pixel P1, the second pixel P2, and the third pixel P3 may emit, for example, red, green, blue, or white light from the organic light emitting diode OLED. Herein, the first pixel P1, the second pixel P2, and the third pixel P3 may be understood as pixels emitting any one of red light, green light, blue light, and white light as described above.

The first pixel P1 may be electrically connected to peripheral circuits arranged (or disposed) in a non-display area NDA. A first scan driving circuit 110, a first emission driving circuit 115, a second scan driving circuit 120, a terminal 140, a data driving circuit 150, a first power supply line 160, and a second power supply line 170 may be arranged (or disposed) in the non-display area NDA. Although not illustrated, the second pixel P2 and the third pixel P3 may also be electrically connected to peripheral circuits arranged (or disposed) in the non-display area NDA.

The first scan driving circuit 110 may provide a scan signal to the first pixel P1 through a scan line SL. The first emission driving circuit 115 may provide an emission control signal to the first pixel P1 through an emission control line EL. Although not illustrated, the first scan driving circuit 110 may provide a scan signal to the second pixel P2 and the third pixel P3 through a scan line SL, and the first emission driving circuit 115 may provide an emission control signal to the second pixel P2 and the third pixel P3 through an emission control line EL.

The second scan driving circuit 120 may be arranged (or disposed) in parallel to the first scan driving circuit 110 with the display area DA therebetween. Some of the first pixels P1 arranged (or disposed) in the display area DA may be electrically connected to the first scan driving circuit 110, and the others may be electrically connected to the second scan driving circuit 120. In an embodiment, a second emission driving circuit (not illustrated) may be arranged (or disposed) in parallel to the first emission driving circuit 115 with the display area DA therebetween.

The first emission driving circuit 115 may be arranged (or disposed) over the non-display area NDA while being spaced apart from the first scan driving circuit 110 in the x direction. In an embodiment, the first emission driving circuit 115 may be arranged (or disposed) alternately in the y direction with the first scan driving circuit 110.

The terminal 140 may be arranged (or disposed) at one side of a substrate 100. The terminal 140 may be exposed, by not being covered by an insulating layer, and may be electrically connected to a printed circuit board PCB. A terminal PCB-P of the printed circuit board PCB may be electrically connected to the terminal 140 of the display apparatus 1. The printed circuit board PCB may be configured to transmit power or signals of a controller (not illustrated) to the display apparatus 1. A control signal generated by the controller may be transmitted to each of the first and second scan driving circuits 110 and 120 and the first emission driving circuit 115 through the printed circuit board PCB. The controller may provide first and second power voltages to the first and second power supply lines 160 and 170 through first and second connection lines 161 and 171, respectively. A first power voltage ELVDD may be provided to the first pixel P1 through a driving voltage line PL electrically connected to the first power supply line 160, and a second power voltage ELVSS may be provided to an opposite electrode of the first pixel P1 electrically connected to the second power supply line 170. Although not illustrated, the first power voltage ELVDD may be provided to the second pixel P2 and the third pixel P3 through the driving voltage line PL electrically connected to the first power supply line 160, and the second power voltage ELVSS may be provided to the opposite electrodes of the second pixel P2 and the third pixel P3 electrically connected to the second power supply line 170.

The data driving circuit 150 may be electrically connected to a data line DL. A data signal of the data driving circuit 150 may be provided to the first pixel P1 through a connection line 151 electrically connected to the terminal 140 and a data line DL electrically connected to the connection line 151. Although not illustrated, the data driving circuit 150 may provide a data signal to the second pixel P2 and the third pixel P3 through the data line DL.

FIG. 2 illustrates that the data driving circuit 150 is arranged on the printed circuit board PCB. In an embodiment, the data driving circuit 150 may be arranged (or disposed) on the substrate 100. For example, the data driving circuit 150 may be arranged (or disposed) between the terminal 140 and the first power supply line 160.

The first power supply line 160 may include a first subline 162 and a second subline 163 extending in parallel in the x direction with the display area DA therebetween. The second power supply line 170 may partially surround the display area DA in a loop shape with one side open.

Figure 3:
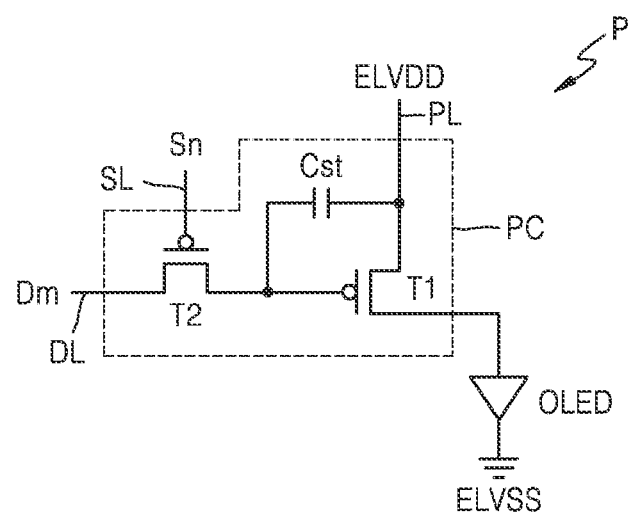
FIG. 3 is a schematic diagram of an equivalent circuit of a pixel that may be included in a display apparatus according to an embodiment.

FIG. 3 is schematic diagram of an equivalent circuit of a pixel that may be included in a display apparatus according to an embodiment.

Referring to FIG. 3, each pixel P (i.e., the first pixel P1, the second pixel P2, or the third pixel P3) may include a pixel circuit PC electrically connected to the scan line SL and the data line DL and an organic light emitting diode OLED electrically connected to the pixel circuit PC.

The pixel circuit PC may include a driving thin film transistor T1, a switching thin film transistor T2, and a storage capacitor Cst. The switching thin film transistor T2 may be electrically connected to the scan line SL and the data line DL and may be configured to transmit a data signal Dm input through the data line DL to the driving thin film transistor T1 according to a scan signal Sn input through the scan line SL.

The storage capacitor Cst may be electrically connected to the switching thin film transistor T2 and the driving voltage line PL and may store a voltage corresponding to the difference between the voltage received from the switching thin film transistor T2 and the first power voltage ELVDD (or driving voltage) supplied to the driving voltage line PL.

The driving thin film transistor T1 may be electrically connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current.

Although FIG. 3 illustrates that the pixel circuit PC includes two thin film transistors and one storage capacitor, the disclosure is not limited thereto. In various embodiments, the pixel circuit PC may include seven thin film transistors and one storage capacitor or may include various five thin film transistors and two storage capacitors.

Figure 4:
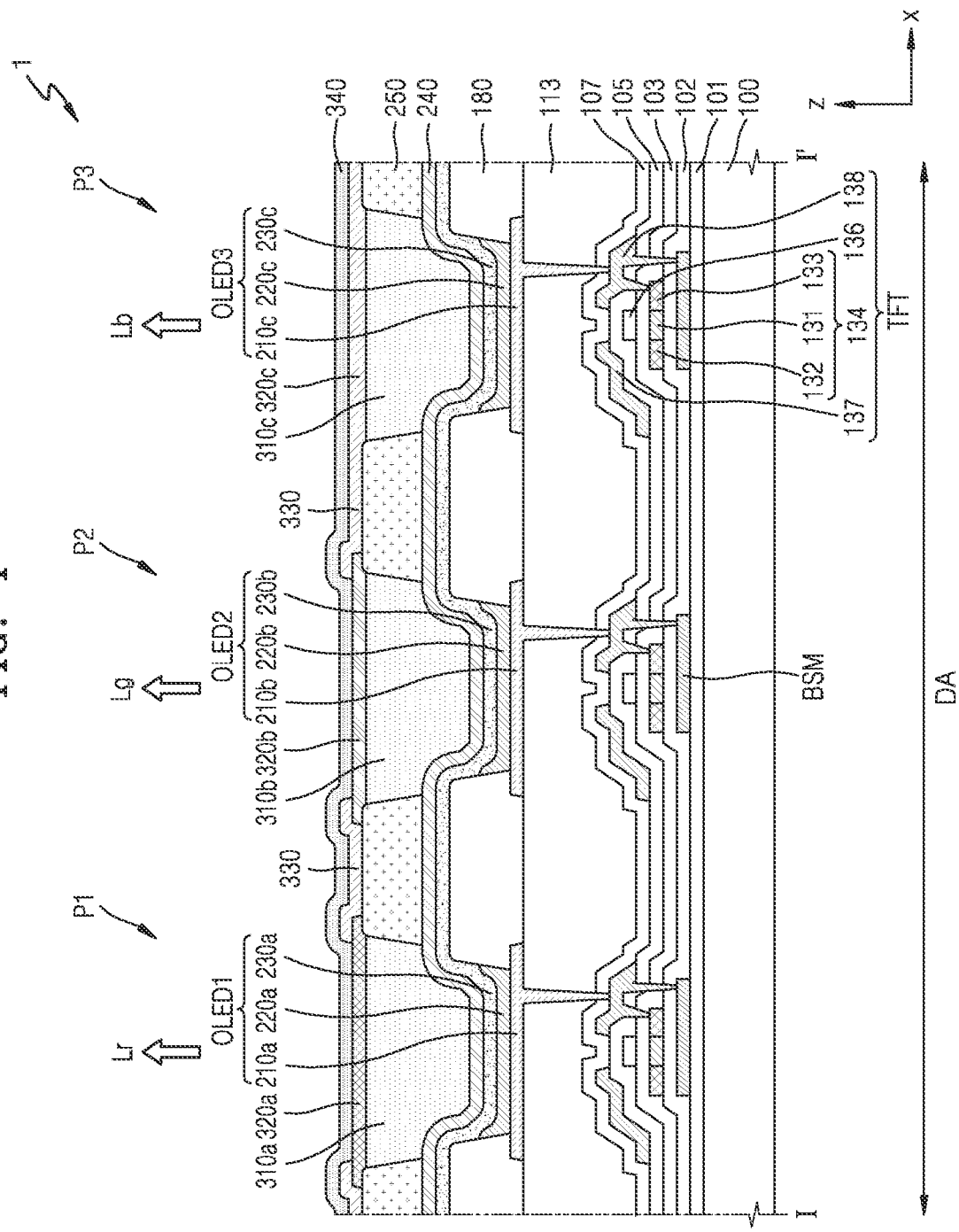
FIG. 4 is a schematic cross-sectional view illustrating a display apparatus according to an embodiment.

FIG. 4 is a schematic cross-sectional view illustrating a display apparatus according to an embodiment.

Referring to FIG. 4, a display apparatus 1 according to an embodiment may include a substrate 100 including a display area DA including a first pixel P1 including a first display device OLED1, a second pixel P2 including a second display device OLED2, and a third pixel P3 including a third display device OLED3, a first protection layer 240 disposed on the first display device OLED1, the second display device OLED2, and the third display device OLED3, a first color conversion layer 310a arranged (or disposed) on the first protection layer 240 corresponding to the first display device OLED1 and including first quantum dots converting incident light into first light Lr, a second color conversion layer 310b arranged (or disposed) on the first protection layer 240 corresponding to the second display device OLED2 and including second quantum dots converting incident light into second light Lg, and a third color conversion layer 310c arranged (or disposed) on the first protection layer 240 corresponding to the third display device OLED3 and including light scattering particles converting incident light into third light Lb by scattering the incident light. The first display device OLED1, the second display device OLED2, and the third display device OLED3 may each include an organic light emitting diode OLED. The first light Lr, the second light Lg, and the third light Lb may have different colors. In an embodiment, the first display device OLED1, the second display device OLED2, and the third display device OLED3 may be display apparatuses emitting blue light.

The substrate 100 may include a glass material or a polymer resin including $SiO_2$ as a main component. The polymer resin may include at least one of polyethersulfone, polyacrylate, polyether imide, polyethylene naphthalate, polyethylene terephthalate, polyphenylene sulfide, polyarylate, polyimide, polycarbonate, cellulose acetate propionate, and the like. The substrate 100 including the polymer resin may be flexible, rollable, or bendable. The substrate 100 may have a multilayer structure including an inorganic layer (not illustrated) and a layer including the above polymer resin.

A buffer layer 101 may be located on the substrate 100 to reduce or block the penetration of foreign materials, moisture, or external air from the bottom of the substrate 100 and may provide a flat surface on the substrate 100. The buffer layer 101 may include an inorganic material such as oxide or nitride, an organic material, or an organic/inorganic composite and may include a single-layer or multi-layer structure of an inorganic material and an organic material. A barrier layer (not illustrated) for blocking the penetration of external air may be further included between the substrate 100 and the buffer layer 101.

A first insulating layer 102 may be arranged (or disposed) on the buffer layer 101. The first insulating layer 102 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 102 may include a single layer or multiple layers including the above inorganic insulating material.

A thin film transistor TFT may be arranged (or disposed) over the first insulating layer 102. The thin film transistor TFT may include a semiconductor layer 134, a gate electrode 136, a source electrode 137, and a drain electrode 138. The thin film transistor TFT may be electrically connected to the first display device OLED1, the second display device OLED2, and the third display device OLED3 to drive the first display device OLED1, the second display device OLED2, and the third display device OLED3.

The semiconductor layer 134 may include a channel area 131 arranged (or disposed) on the first insulating layer 102 and may overlap the gate electrode 136 and a source area 132 and a drain area 133 arranged (or disposed) at both sides of the channel area 131 and may include impurities of a higher concentration than the channel area 131. Here, the impurities may include N-type impurities or P-type impurities. The source area 132 and the drain area 133 may be electrically connected to the source electrode 137 and the drain electrode 138 of the thin film transistor TFT, respectively.

The semiconductor layer 134 may include an oxide semiconductor and/or a silicon semiconductor. When the semiconductor layer 134 includes an oxide semiconductor, the semiconductor layer 134 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the semiconductor layer 134 may include InSnZnO (ITZO) or InGaZnO (IGZO). When the semiconductor layer 134 includes a silicon semiconductor, the semiconductor layer 134 may include, for example, amorphous silicon (a-Si) or low temperature poly-silicon (LTPS) crystallized from amorphous silicon (a-Si).

The gate electrode 136 may include a single layer or multiple layers formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be electrically connected to a gate line for applying an electrical signal to the gate electrode 136.

A second insulating layer 103 may be arranged between the semiconductor layer 134 and the gate electrode 136. The second insulating layer 103 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 103 may include a single layer or multiple layers including the above inorganic insulating material.

A third insulating layer 105 may be provided to cover the gate electrode 136. The third insulating layer 105 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 105 may include a single layer or multiple layers including the above inorganic insulating material.

The source electrode 137 and the drain electrode 138 may be arranged on the third insulating layer 105. The source electrode 137 and the drain electrode 138 may include a conductive material including molybdenum (Mo), aluminum (Al), copper (Cu), titanium (Ti), or the like and may include a single layer or multiple layers including the above conductive material. For example, the source electrode 137 and the drain electrode 138 may include a multilayer structure of Ti/Al/Ti.

A fourth insulating layer 107 may be arranged on the source electrode 137 and the drain electrode 138. The fourth insulating layer 107 may prevent a line or the like, which includes a metal such as aluminum which may be damaged by an etchant, from being exposed to etching environment in a display apparatus manufacturing process. The fourth insulating layer 107 may be arranged to extend to a non-display area NDA. In some embodiments, the fourth insulating layer 107 may be omitted.

A planarization layer 113 may be arranged on the fourth insulating layer 107. The planarization layer 113 may have a flat upper surface such that a pixel electrode arranged thereon may be formed flat.

The planarization layer 113 may include a single layer or multiple layers formed of an organic material or an inorganic material. The planarization layer 113 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. The planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). After the forming of the planarization layer 113, chemical mechanical polishing may be performed to provide a flat upper surface.

The planarization layer 113 may include an opening exposing one of the source electrode 137 and the drain electrode 138 of the thin film transistor TFT, and the pixel electrode may contact the source electrode 137 or the drain electrode 138 through the opening to be electrically connected to the thin film transistor TFT.

A bias electrode BSM may be arranged between the buffer layer 101 and the semiconductor layer 134 to correspond to the thin film transistor TFT. A voltage may be applied to the bias electrode BSM. For example, the bias electrode BSM may be electrically connected to the source electrode 137 or the drain electrode 138 of the thin film transistor TFT. Because the bias electrode BSM may be supplied with a voltage in conjunction with the potential of the source electrode 137 or the drain electrode 138 of the thin film transistor TFT, the thin film transistor TFT may be stabilized. In an embodiment, the bias electrode BSM may be electrically connected to a separate bias line without being electrically connected to the source electrode 137 or the drain electrode 138 of the thin film transistor TFT.

On the planarization layer 113 of the substrate 100, the first display device OLED1 including a first pixel electrode 210a, a first intermediate layer 220a, and a first opposite electrode 230a arranged to face the first pixel electrode 210a with the first intermediate layer 220a therebetween may be located, the second display device OLED2 including a second pixel electrode 210b, a second intermediate layer 220b, and a second opposite electrode 230b arranged to face the second pixel electrode 210b with the second intermediate layer 220b therebetween may be located, and the third display device OLED2 including a third pixel electrode 210c, a third intermediate layer 220c, and a third opposite electrode 230c arranged to face the third pixel electrode 210c with the third intermediate layer 220c therebetween may be located.

The first pixel electrode 210a, the second pixel electrode 210b, and the third pixel electrode 210c may be arranged on the planarization layer 113. The first pixel electrode 210a, the second pixel electrode 210b, and the third pixel electrode 210c may be a (semi)transparent electrode or a reflective electrode. The first pixel electrode 210a, the second pixel electrode 210b, and the third pixel electrode 210c may include a reflection layer formed of Ag, Mg, Al, Pt, Pd, Au, Ni, Nd, Ir, Cr, or any compound thereof and a transparent or semitransparent electrode layer formed on the reflection layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The first pixel electrode 210a, the second pixel electrode 210b, and the third pixel electrode 210c may be provided in a stack structure of ITO/Ag/ITO.

A pixel definition layer 180 may be arranged on the planarization layer 113, and the pixel definition layer 180 may include an opening exposing at least a portion of the first pixel electrode 210a, an opening exposing at least a portion of the second pixel electrode 210b, and an opening exposing at least a portion of the third pixel electrode 210c. The pixel definition layer 180 may increase the distance between the edge of the first pixel electrode 210a and the first opposite electrode 230a over the first pixel electrode 210a to prevent an arc or the like from occurring at the edge of the first pixel electrode 210a, may increase the distance between the edge of the second pixel electrode 210b and the second opposite electrode 230b over the second pixel electrode 210b to prevent an arc or the like from occurring at the edge of the second pixel electrode 210b, and may increase the distance between the edge of the third pixel electrode 210c and the third opposite electrode 230c over the third pixel electrode 210c to prevent an arc or the like from occurring at the edge of the third pixel electrode 210c. For example, the pixel definition layer 180 may be formed of an organic insulating material such as polyimide, polyamide, acrylic resin, benzocyclobutene, hexamethyldisiloxane (HMDSO), or phenol resin by spin coating or the like.

The first intermediate layer 220a may be arranged on the first pixel electrode 210a at least partially exposed by the pixel definition layer 180, the second intermediate layer 220b may be arranged on the second pixel electrode 210b, and the third intermediate layer 220c may be arranged on the third pixel electrode 210c. The first intermediate layer 220a, the second intermediate layer 220b, and the third intermediate layer 220c may include an emission layer, and functional layers such as a hole transport layer (HTL), a hole injection layer (HIL), an electron transport layer (ETL), and an electron injection layer (EIL) may optionally be further included under and over the emission layer.

The emission layer may include an organic material including a fluorescent or phosphorescent material emitting red, green, blue, or white light. The emission layer may include a low-molecular weight organic material or a high-molecular weight organic material. For example, the emission layer included in the first intermediate layer 220a, the second intermediate layer 220b, and the third intermediate layer 220c may include a material emitting blue light.

When the emission layer includes a low-molecular weight material, the first intermediate layer 220a, the second intermediate layer 220b, and the third intermediate layer 220c may include a structure in which a hole injection layer (HIL), a hole transport layer (HTL), an emission layer (EML), an electron transport layer (ETL), an electron injection layer (EIL), and the like are stacked in a single or complex structure and the low-molecular weight organic material may include various organic materials such as copper phthalocyanine (CuPc), N,N'-di(naphthalene-1-yl)-N,N'-diphenyl-benzidine(N,N-Di(napthalene-1-yl)-N,N'-diphenyl-benzidine (NPB), and tris-8-hydroxyquinoline aluminum (Alq3). These layers may be formed by vacuum deposition.

When the emission layer includes a high-molecular weight material, the first intermediate layer 220a, the second intermediate layer 220b, and the third intermediate layer 220c may generally have a structure including a hole transport layer (HTL) and an emission layer (EML). The hole transport layer may include poly(3,4-ethylenedioxythiophene) (PEDOT) and the emission layer may include a high-molecular weight material such as poly-phenylene vinylene (PPV) and polyfluorene. The emission layer may be formed by screen printing, inkjet printing, laser induced thermal imaging (LITI), or the like.

Although it is illustrated that the first intermediate layer 220a, the second intermediate layer 220b, and the third intermediate layer 220c are separately provided in the respective pixels P1, P2, and P3, the disclosure is not limited thereto. The first intermediate layer 220a, the second intermediate layer 220b, and the third intermediate layer 220c may be integrally formed in the respective pixels P1, P2, and P3.

In the embodiment, the first display device OLED1, the second display device OLED2, and the third display device OLED3 respectively provided in the first pixel P1, the second pixel P2, and the third pixel P3 may all include an emission layer emitting the same color light. For example, the first display device OLED1, the second display device OLED2, and the third display device OLED3 respectively provided in the first pixel P1, the second pixel P2, and the third pixel P3 may all emit blue light.

The first opposite electrode 230a, the second opposite electrode 230b, and the third opposite electrode 230c may be arranged on the first intermediate layer 220a, the second intermediate layer 220b, and the third intermediate layer 220c, respectively. The first opposite electrode 230a may be arranged on the first intermediate layer 220a to entirely cover the first intermediate layer 220a, the second opposite electrode 230b may be arranged on the second intermediate layer 220b to entirely cover the second intermediate layer 220b, and the third opposite electrode 230c may be arranged on the third intermediate layer 220c to entirely cover the third intermediate layer 220c. In an embodiment, the first opposite electrode 230a, the second opposite electrode 230b, and the third opposite electrode 230c may be integrally formed.

The first opposite electrode 230a, the second opposite electrode 230b, and the third opposite electrode 230c may include a conductive material having a low work function. For example, the first opposite electrode 230a, the second opposite electrode 230b, and the third opposite electrode 230c may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. The first opposite electrode 230a, the second opposite electrode 230b, and the third opposite electrode 230c may further include a layer such as ITO, IZO, ZnO, or $In_2O_3$ on the (semi) transparent layer including the above material.

A spacer (not illustrated) may be further included on the pixel definition layer 180 to prevent mask marking. The spacer may be integrally formed with the pixel definition layer 180. For example, the spacer and the pixel definition layer 180 may be simultaneously formed in the same process by using a halftone mask process.

In the case of a display apparatus of the related art, the display apparatus is manufactured by a process of bonding a first substrate where a display device is arranged to a second substrate where a color conversion layer is arranged; however, there may be a problem in that a failure occurs due to a misalignment in the process of bonding the first substrate to the second substrate or light efficiency decreases due to a filler arranged between the first substrate and the second substrate.

Thus, the display apparatus 1 according to an embodiment may have a structure in which the display device and the color conversion layer are sequentially arranged on one substrate without a bonding process. Accordingly, because the display device and the color conversion layer are arranged adjacent to each other, the light efficiency and the color reproducibility may be improved.

The first protection layer 240 may be arranged on the first opposite electrode 230a, the second opposite electrode 230b, and the third opposite electrode 230c. The first protection layer 240 may be arranged to cover the first opposite electrode 230a, the second opposite electrode 230b, and the third opposite electrode 230c. The first protection layer 240 may include an inorganic material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first protection layer 240 may include a single layer or multiple layers including the above inorganic material.

A barrier 250 may be arranged on the first protection layer 240, and the barrier 250 may have an opening exposing at least a portion of the first protection layer 240. More particularly, the barrier 250 may be arranged on the first protection layer 240 to expose at least a portion of the first protection layer 240 corresponding to the first display device OLED1, the second display device OLED2, and the third display device OLED3. For example, the barrier 250 may include an organic material such as polyimide, polyamide, acrylic resin, benzocyclobutene, hexamethyldisiloxane (HMDSO), or phenol resin.

On the first protection layer 240 at least partially exposed by the barrier 250, the first color conversion layer 310a including first quantum dots converting incident light into first light Lr corresponding to the first display device OLED1 of the first pixel P1 may be arranged (or disposed), the second color conversion layer 310b including second quantum dots converting incident light into second light Lg corresponding to the second display device OLED2 of the second pixel P2 may be arranged (or disposed), and the third color conversion layer 310c including light scattering particles converting incident light into third light Lb corresponding to the third display device OLED3 of the third pixel P3 may be arranged (or disposed).

In an embodiment, the first color conversion layer 310a, the second color conversion layer 310b, and the third color conversion layer 310c may be directly arranged (or disposed) on the first protection layer 240. Because the first color conversion layer 310a, the second color conversion layer 310b, and the third color conversion layer 310c are directly arranged (or disposed) on the first protection layer 240, the distance between the first display device OLED1 and the first color conversion layer 310a, the distance between the second display device OLED2 and the second color conversion layer 310b, and the distance between the third display device OLED3 and the third color conversion layer 310c may decrease and thus the light efficiency of the display apparatus may be improved.

The first quantum dots may be excited by blue incident light to isotropically emit first light Lr having a longer wavelength than blue light. The second quantum dots may be excited by blue incident light to isotropically emit second light Lg having a longer wavelength than blue light.

The first color conversion layer 310a, the second color conversion layer 310b, and the third color conversion layer 310c may include a photosensitive polymer in which light scattering particles are dispersed. The photosensitive polymer may include an organic material having light transmittance. The light scattering particles may increase the color conversion ratio of the first color conversion layer 310a and the second color conversion layer 310b by exciting more quantum dots by scattering a portion of incident light that is not absorbed by quantum dots. For example, the light scattering particles may include titanium oxide ($TiO_2$) or metal particles.

The core of the quantum dots may be selected from a Group II-VI compound, a Group III-V compound, a Group IV-VI compound, a group IV element, a Group IV compound, and any combination thereof.

The Group II-VI compound may be selected among a binary compound selected from CdSe, CdTe, ZnS, ZnSe, ZnTe, ZnO, HgS, HgSe, HgTe, MgSe, MgS, and any mixture thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-V compound may be selected among a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The Group IV-VI compound may be selected among a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The Group IV element may be selected from Si, Ge, and any mixture thereof. The Group IV compound may include a binary compound selected from SiC, SiGe, and any mixture thereof.

The binary compound, the ternary compound, or the quaternary compound may exist in particles at a uniform concentration or may exist in the same particle with a concentration distribution partially divided into different states. Also, it may have a core/shell structure in which one quantum dot surrounds another quantum dot. The interface between the core and the shell may have a concentration gradient in which the concentration of elements in the shell decreases toward the center thereof.

In some embodiments, the quantum dot may have a core-shell structure including a core including nanocrystals and a shell surrounding the core, as described above. The shell of the quantum dot may function as a protection layer for preventing chemical modification of the core to maintain semiconductor characteristics and/or as a charging layer for assigning electrophoretic characteristics to the quantum dot. The shell may include a single layer or a multiple layer. The interface between the core and the shell may have a concentration gradient in which the concentration of elements in the shell decreases toward the center thereof. Examples of the shell of the quantum dot may include a metal or nonmetal oxide, a semiconductor compound, or any combination thereof.

For example, the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$; however, the disclosure is not limited thereto.

Also, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, the disclosure is not limited thereto.

The quantum dot may have a full width of half maximum (FWHM) of an emission wavelength spectrum of about 45 nm or less, for example, about 40 nm or less or about 30 nm or less, and in this range, the color purity or the color reproducibility thereof may be improved. Also, because the light emitted through the quantum dot is emitted in all directions, the optical viewing angle thereof may be improved.

Also, the shapes of the quantum dots may be those generally used in the art and may include, but not limited to, spherical, pyramidal, multi-arm, or cubic nanoparticles, nanotubes, nanowires, nanofibers, nanoplate particles, or the like.

The quantum dot may control the color of light emitted according to the particle size, and thus the quantum dot may have various emission colors such as blue, red, and green.

The second quantum dots may be selected from a Group II-VI compound, a Group III-V compound, a Group IV-VI compound, a group IV element, a Group IV compound, and any combination thereof. The second quantum dots may include the same material as the first quantum dots, wherein the size of the second quantum dots and the size of the first quantum dots may be equal to each other; however, the disclosure is not limited thereto. In an embodiment, the size of the second quantum dots may be smaller than the size of the first quantum dots.

A first color filter 320a may be arranged (or disposed) on the first color conversion layer 310a, a second color filter 320b may be arranged (or disposed) on the second color conversion layer 310b, and a third color filter 320c may be arranged (or disposed) on the third color conversion layer 310c. The first color filter 320a may selectively transmit the first light Lr, the second color filter 320b may selectively transmit the second light Lg, and the third color filter 320c may selectively transmit the third light Lb. For example, the first color filter 320a may be arranged corresponding to the first pixel P1 to selectively transmit red light, the second color filter 320b may be arranged corresponding to the second pixel P2 to selectively transmit green light, and the third color filter 320c may be arranged corresponding to the third pixel P3 to selectively transmit blue light.

A light blocking member 330 may be arranged on the barrier 250. The light blocking member 330 may be arranged between the first pixel P1 and the second pixel P2 and between the second pixel P2 and the third pixel P3. In an embodiment, at least a portion of the light blocking member 330 may be arranged on the first color filter 320a and the second color filter 320b. The light blocking member 330 may function as an auxiliary light shield such that light may not be emitted from a non-emission area. The light blocking member 330 may include the same material as the third color filter 320c. In an embodiment, the light blocking member 330 and the third color filter 320c may include a same material. In an embodiment, the light blocking member 330 may include a black matrix, a black pigment, a metal material, or the like.

A second protection layer 340 may be arranged on the first color filter 320a, the second color filter 320b, and the third color filter 320c. The second protection layer 340 may be arranged to cover the first color filter 320a, the second color filter 320b, and the third color filter 320c. The second protection layer 340 may include an inorganic material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second protection layer 340 may include a single layer or multiple layers including the above inorganic material.

In an embodiment, when the display apparatus 1 does not include a thin film encapsulation layer 400 that will be described below, the first protection layer 240, the barrier 250, and the second protection layer 340 arranged on the display device may function as the thin film encapsulation layer 400. For example, because the first protection layer 240, the barrier 250, and the second protection layer 340 are sequentially arranged on the first opposite electrode 230a, the second opposite electrode 230b, and the third opposite electrode 230c, the first display device OLED1, the second display device OLED2, and the third display device OLED3 may be protected from external moisture and oxygen.

Figure 5:
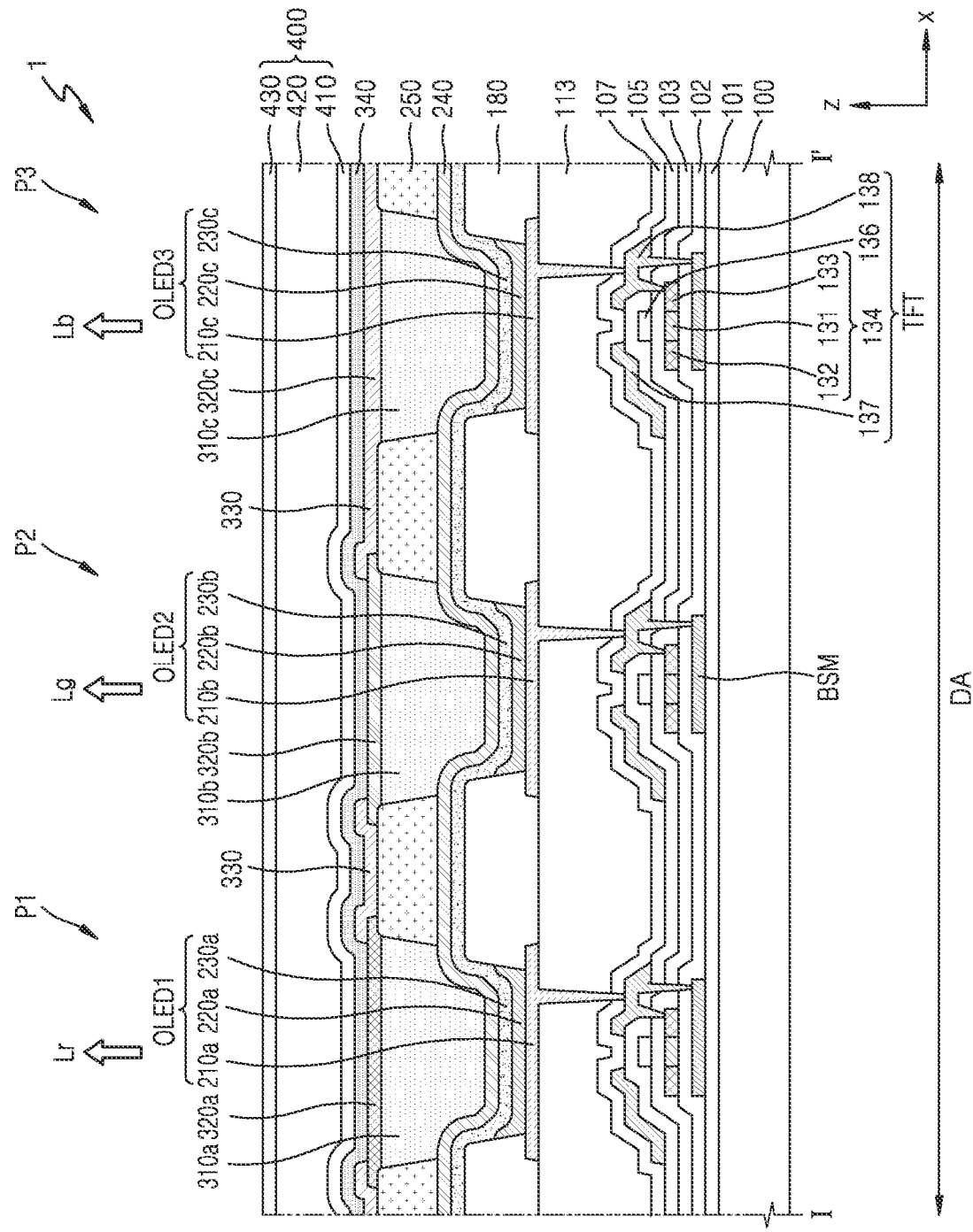
FIG. 5 is a schematic cross-sectional view illustrating a display apparatus according to an embodiment.

FIG. 5 is a schematic cross-sectional view illustrating a display apparatus according to an embodiment. More particularly, FIG. 5 is a diagram illustrating an embodiment where the thin film encapsulation layer 400 is arranged on the second protection layer 340.

Referring to FIG. 5, the thin film encapsulation layer 400 may be arranged (or disposed) on the second protection layer 340. In an embodiment, the thin film encapsulation layer 400 may be directly arranged (or directly disposed) on the second protection layer 340. The thin film encapsulation layer 400 may cover (or overlap) the display area DA and extend to the outside of the display area DA. The thin film encapsulation layer 400 may include at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430. Because the thin film encapsulation layer 400 is arranged (or disposed) on the second protection layer 340, the display apparatus 1 may be protected from external moisture and oxygen.

The first inorganic encapsulation layer 410 and the second inorganic encapsulation layer 430 may include one or more inorganic insulating materials, which may include at least one of aluminum oxide, titanium oxide, tantalum oxide, hafnium oxide, zinc oxide, silicon oxide, silicon nitride, and silicon oxynitride. The organic encapsulation layer 420 may include a polymer-based material. The polymer-based material may include acrylic resin, epoxy resin, polyimide, polyethylene, or the like. In an embodiment, when the thin film encapsulation layer 400 is directly arranged on the color filter, the second protection layer 340 may be used as the first inorganic encapsulation layer 410 of the thin film encapsulation layer 400.

Figure 6A:
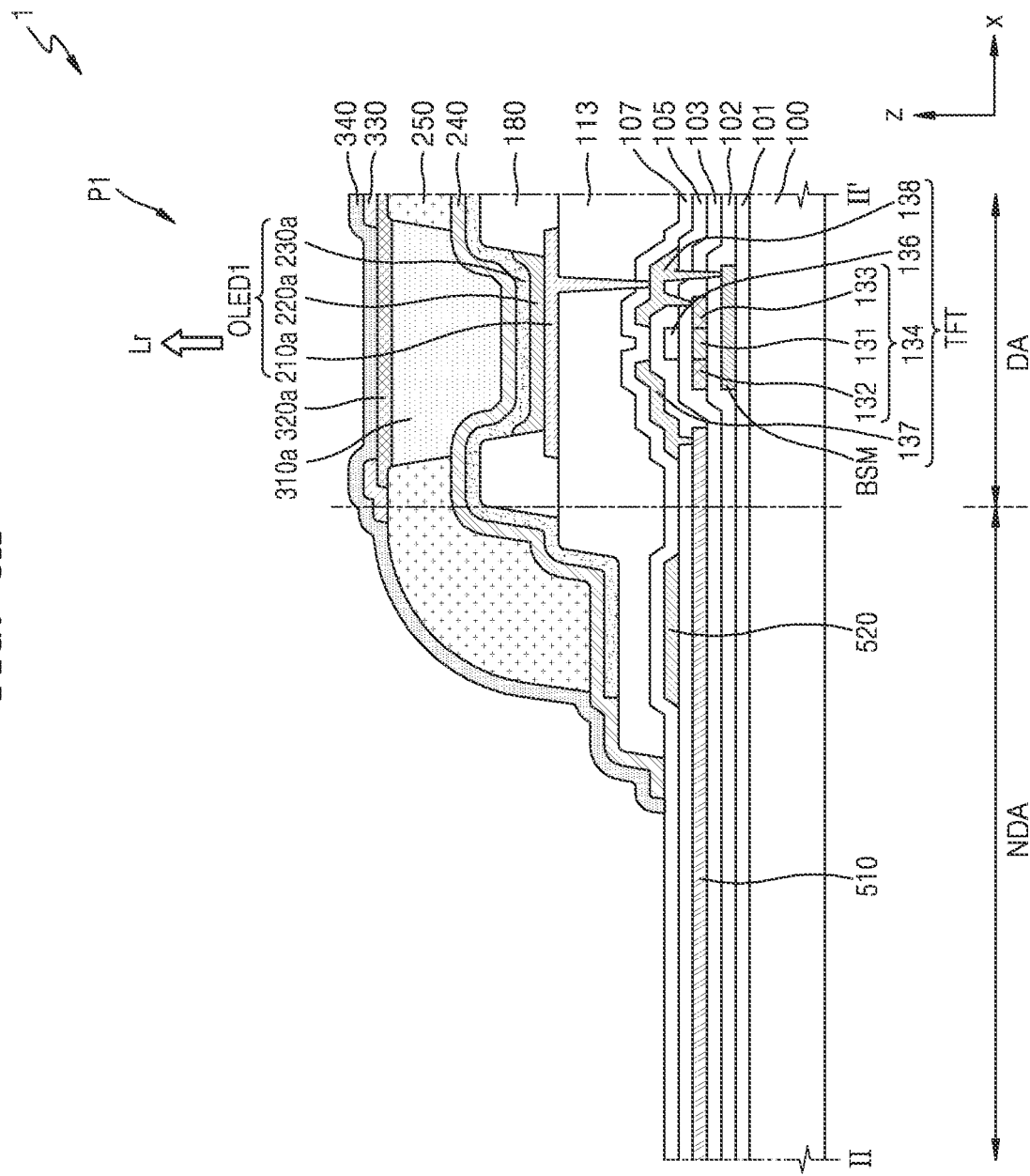
FIGS. 6A and 6B are schematic cross-sectional views illustrating a display apparatus according to an embodiment.
Figure 6B:
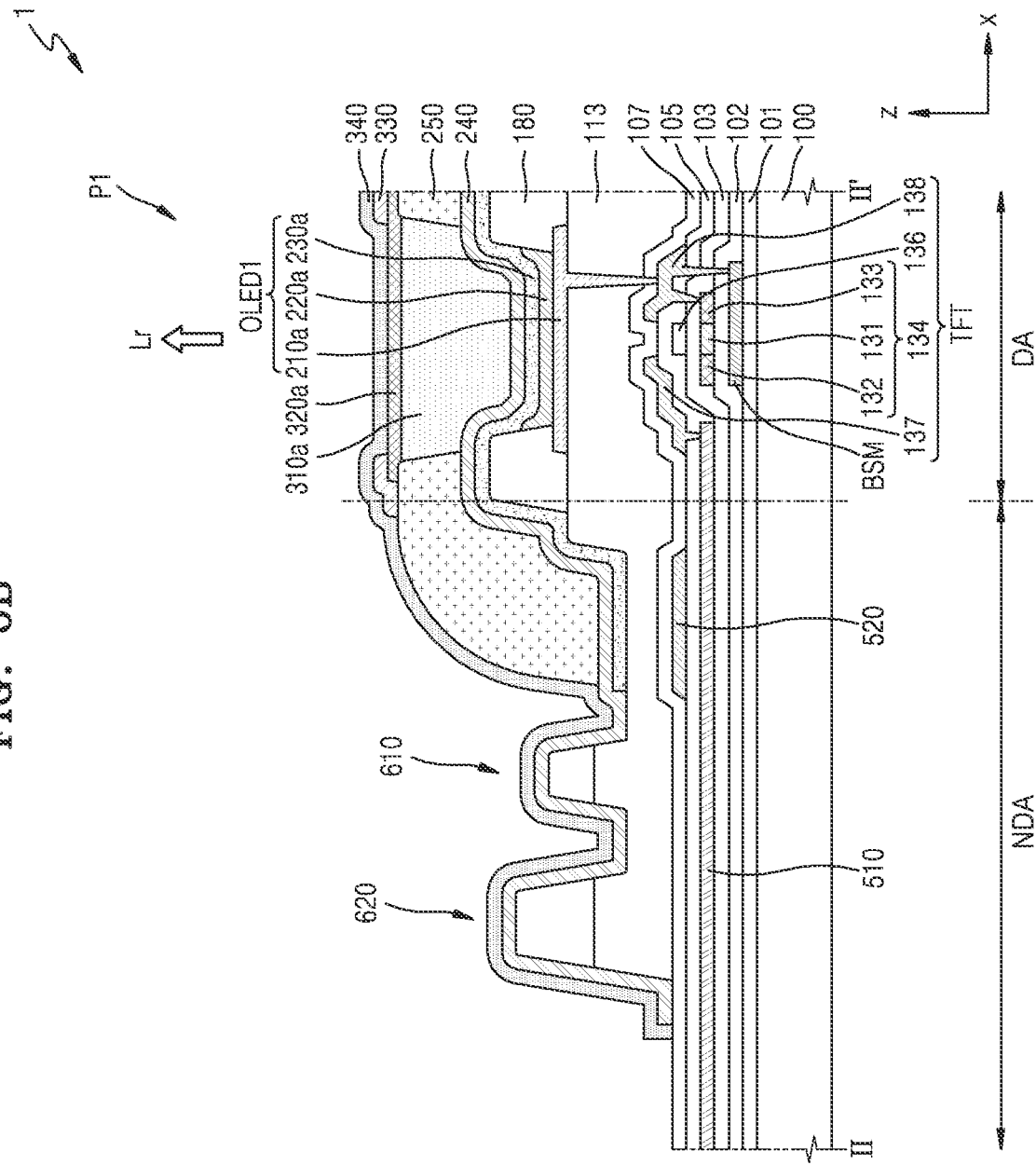

FIGS. 6A and 6B are schematic cross-sectional views illustrating a display apparatus according to an embodiment.

Referring to FIG. 6A, a first conductive layer 510 and a second conductive layer 520 may be arranged on the non-display area NDA of the display apparatus 1 according to an embodiment. The first conductive layer 510 and the second conductive layer 520 may provide at least one of a data signal, a scan signal, an emission control signal, and a power voltage to the pixel P1 arranged on the display area DA. In an embodiment, the first conductive layer 510 may include the same material as the gate electrode 136 described above, and the second conductive layer 520 may include the same material as the source electrode 137 or the drain electrode 138 described above.

The first opposite electrode 230a arranged on the display area DA may be arranged to extend to the non-display area NDA. Also, the first protection layer 240 and the second protection layer 340 arranged on the display area DA may extend to the non-display area NDA and may contact each other on the non-display area NDA.

Referring to FIG. 6B, a first dam portion 610 and a second dam portion 620 may be arranged on the non-display area NDA of the display apparatus 1 according to the embodiment. The first dam portion 610 and the second dam portion 620 may block the material of the barrier 250, which is arranged on the first protection layer 240, from flowing toward the edge of the substrate 100. Also, although not illustrated, when the display apparatus 1 includes the thin film encapsulation layer 400 described above, the first dam portion 610 and the second dam portion 620 may prevent an edge tail of the organic encapsulation layer 420 from being formed, by blocking the organic material from flowing toward the edge of the substrate 100 when forming the organic encapsulation layer 420 of the thin film encapsulation layer 400. The first dam portion 610 and the second dam portion 620 may be arranged on the non-display area NDA to be adjacent to (or to surround) the periphery of the display area DA. Although FIG. 6B illustrates that the display apparatus 1 includes two dam portions, the disclosure is not limited thereto.

FIGS. 7A to 7G are schematic cross-sectional views illustrating a portion of a process of manufacturing a display apparatus.

Hereinafter, a method of manufacturing a display apparatus will be described in detail with reference to FIGS. 7A to 7G.

Referring to FIGS. 7A to 7G, a method of manufacturing a display apparatus according to an embodiment may include forming a first display device OLED1, a second display device OLED2, and a third display device OLED3 on a substrate 100; forming a first protection layer 240 on the first display device OLED1, the second display device OLED2, and the third display device OLED3; forming a barrier 250 on the first protection layer 240, the barrier 250 exposing a part of the first protection layer 240, which corresponds to the first display device OLED1, the second display device OLED2, and the third display device OLED3; forming a first color conversion layer 310a on the first protection layer 240 corresponding to the first display device OLED1, the first color conversion layer 310a including first quantum dots converting incident light into first light Lr; forming a second color conversion layer 310b on the first protection layer 240 corresponding to the second display device OLED2, the second color conversion layer 310b including second quantum dots converting incident light into second light Lg; and forming a third color conversion layer 310c on the first protection layer 240 corresponding to the third display device OLED3, the third color conversion layer 310c including light scattering particles converting incident light into third light Lb. The first light Lr, the second light Lg, and the third light Lb may have different colors.

The substrate 100 may include a glass material. For example, the substrate 100 may include a glass material including $SiO_2$ as a main component. In an embodiment, the substrate 100 may include a polymer resin. The polymer resin may include at least one of polyethersulfone, polyacrylate, polyether imide, polyethylene naphthalate, polyethylene terephthalate, polyphenylene sulfide, polyarylate, polyimide, polycarbonate, cellulose acetate propionate, and the like. The substrate 100 including the polymer resin may be flexible, rollable, or bendable. The substrate 100 may have a multilayer structure including an inorganic layer (not illustrated) and a layer including the above polymer resin.

Referring to FIG. 7A, after the preparing of the substrate 100, a first display device OLED1, a second display device OLED2, and a third display device OLED3 may be formed on the substrate 100. The first display device OLED1 may include a first pixel electrode 210a, a first intermediate layer 220a, and a first opposite electrode 230a arranged to face the first pixel electrode 210a with the first intermediate layer 220a therebetween; the second display device OLED2 may include a second pixel electrode 210b, a second intermediate layer 220b, and a second opposite electrode 230b arranged to face the second pixel electrode 210b with the second intermediate layer 220b therebetween; and the third display device OLED3 may include a third pixel electrode 210c, a third intermediate layer 220c, and a third opposite electrode 230c arranged to face the third pixel electrode 210c with the third intermediate layer 220c therebetween.

The first pixel electrode 210a, the second pixel electrode 210b, and the third pixel electrode 210c may be a (semi) transparent electrode or a reflective electrode. The first pixel electrode 210a, the second pixel electrode 210b, and the third pixel electrode 210c may include a reflection layer formed of Ag, Mg, Al, Pt, Pd, Au, Ni, Nd, Ir, Cr, or any compound thereof and a transparent or semitransparent electrode layer formed on the reflection layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The first pixel electrode 210a, the second pixel electrode 210b, and the third pixel electrode 210c may be provided in a stack structure of ITO/Ag/ITO.

The first intermediate layer 220a may be arranged on the first pixel electrode 210a, the second intermediate layer 220b may be arranged on the second pixel electrode 210b, and the third intermediate layer 220c may be arranged on the third pixel electrode 210c. The first intermediate layer 220a, the second intermediate layer 220b, and the third intermediate layer 220c may include an emission layer, and functional layers such as a hole transport layer (HTL), a hole injection layer (HIL), an electron transport layer (ETL), and an electron injection layer (EIL) may optionally be further included under and over the emission layer.

The emission layer may include an organic material including a fluorescent or phosphorescent material emitting red, green, blue, or white light. The emission layer may include a low-molecular weight organic material or a high-molecular weight organic material. For example, the emission layer included in the first intermediate layer 220a, the second intermediate layer 220b, and the third intermediate layer 220c may include a material emitting blue light.

The first opposite electrode 230a, the second opposite electrode 230b, and the third opposite electrode 230c may be arranged on the first intermediate layer 220a, the second intermediate layer 220b, and the third intermediate layer 220c, respectively. The first opposite electrode 230a may be arranged on the first intermediate layer 220a to entirely cover the first intermediate layer 220a, the second opposite electrode 230b may be arranged on the second intermediate layer 220b to entirely cover the second intermediate layer 220b, and the third opposite electrode 230c may be arranged on the third intermediate layer 220c to entirely cover the third intermediate layer 220c. In an embodiment, the first opposite electrode 230a, the second opposite electrode 230b, and the third opposite electrode 230c may be integrally formed.

The first opposite electrode 230a, the second opposite electrode 230b, and the third opposite electrode 230c may include a conductive material having a low work function. For example, the first opposite electrode 230a, the second opposite electrode 230b, and the third opposite electrode 230c may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. The first opposite electrode 230a, the second opposite electrode 230b, and the third opposite electrode 230c may further include a layer such as ITO, IZO, ZnO, or $In_2O_3$ on the (semi) transparent layer including the above material.

Figure 7B:
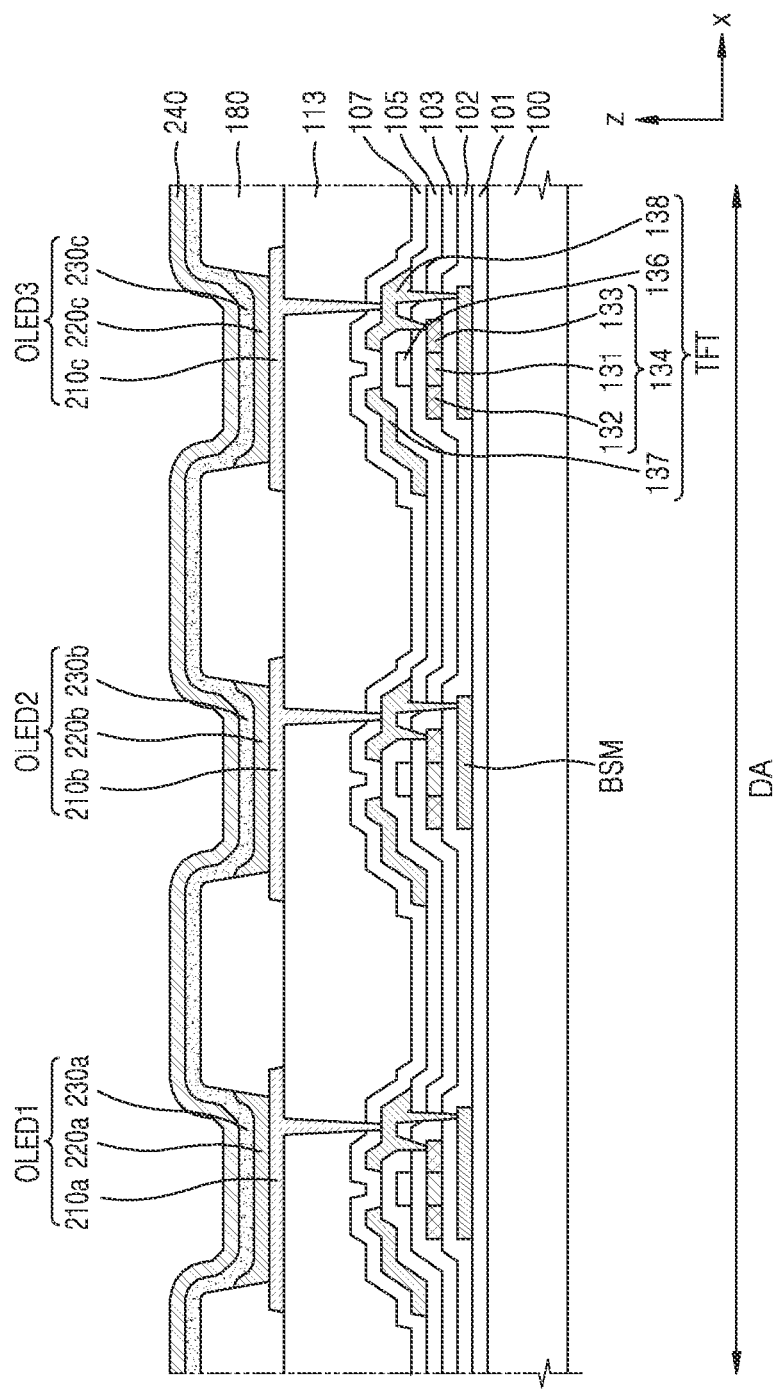

Referring to FIG. 7B, after the forming of the first display device OLED1, the second display device OLED2, and the third display device OLED3 on the substrate 100, a first protection layer 240 may be formed on the first display device OLED1, the second display device OLED2, and the third display device OLED3.

The first protection layer 240 may be arranged (or disposed) on the first opposite electrode 230a, the second opposite electrode 230b, and the third opposite electrode 230c. The first protection layer 240 may include an inorganic material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first protection layer 240 may include a single layer or multiple layers including the above inorganic material.

Figure 7C:
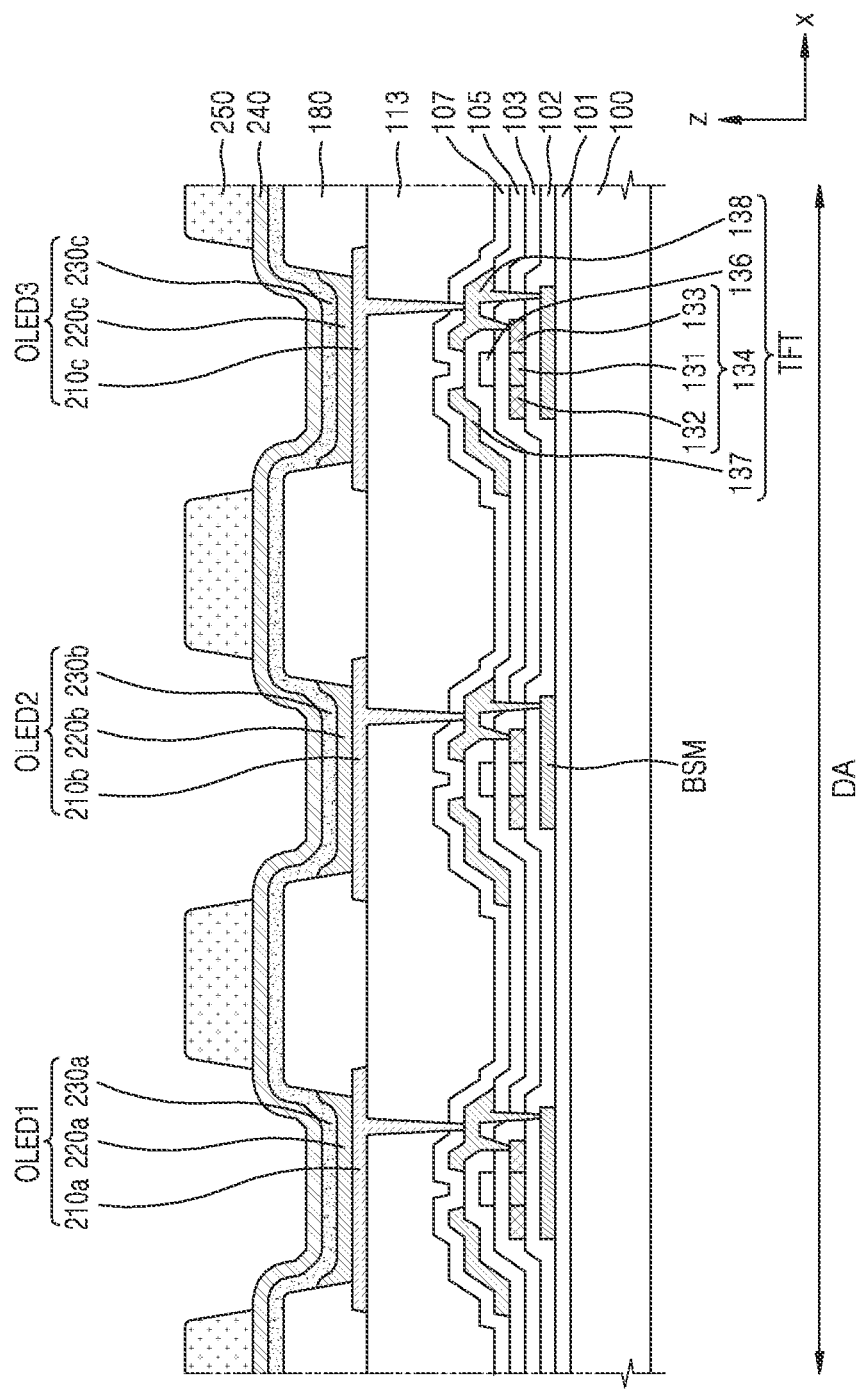

Referring to FIG. 7C, after the forming of the first protection layer 240, a barrier 250 may be formed on the first protection layer 240 exposing a part of the first protection layer 240, which corresponds to the first display device OLED1, the second display device OLED2, and the third display device OLED3. For example, the barrier 250 may include an organic material such as polyimide, polyamide, acrylic resin, benzocyclobutene, hexamethyldisiloxane (HMDSO), or phenol resin.

Figure 7D:
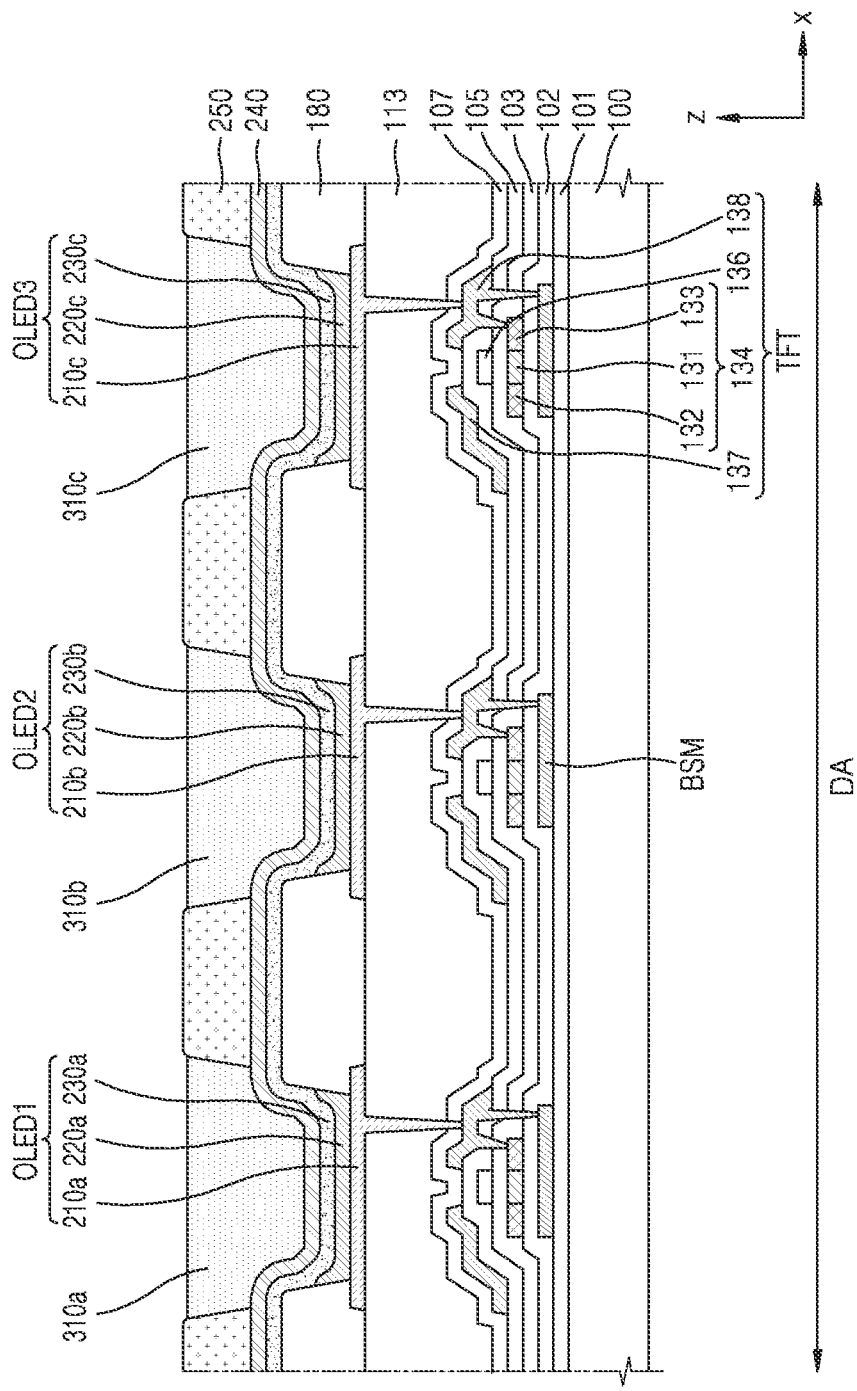

Referring to FIG. 7D, after the forming of the barrier 250 on the first protection layer 240, a first color conversion layer 310a may be formed on the first protection layer 240 corresponding to the first display device OLED1, the first color conversion layer 310a including the first quantum dots converting incident light into first light Lr; a second color conversion layer 310b may be formed on the first protection layer 240 corresponding to the second display device OLED2, the second color conversion layer 310b including second quantum dots converting incident light into second light Lg; and a third color conversion layer 310c may be formed on the first protection layer 240 corresponding to the third display device OLED3, the first color conversion layer 310c including light scattering particles converting incident light into third light Lb.

In an embodiment, the first color conversion layer 310a, the second color conversion layer 310b, and the third color conversion layer 310c may be directly formed on the first protection layer 240. Because the first color conversion layer 310a, the second color conversion layer 310b, and the third color conversion layer 310c are directly formed on the first protection layer 240, the distance between the first display device OLED1 and the first color conversion layer 310a, the distance between the second display device OLED2 and the second color conversion layer 310b, and the distance between the third display device OLED3 and the third color conversion layer 310c may decrease and thus the light efficiency of the display apparatus may be improved.

Figure 7E:
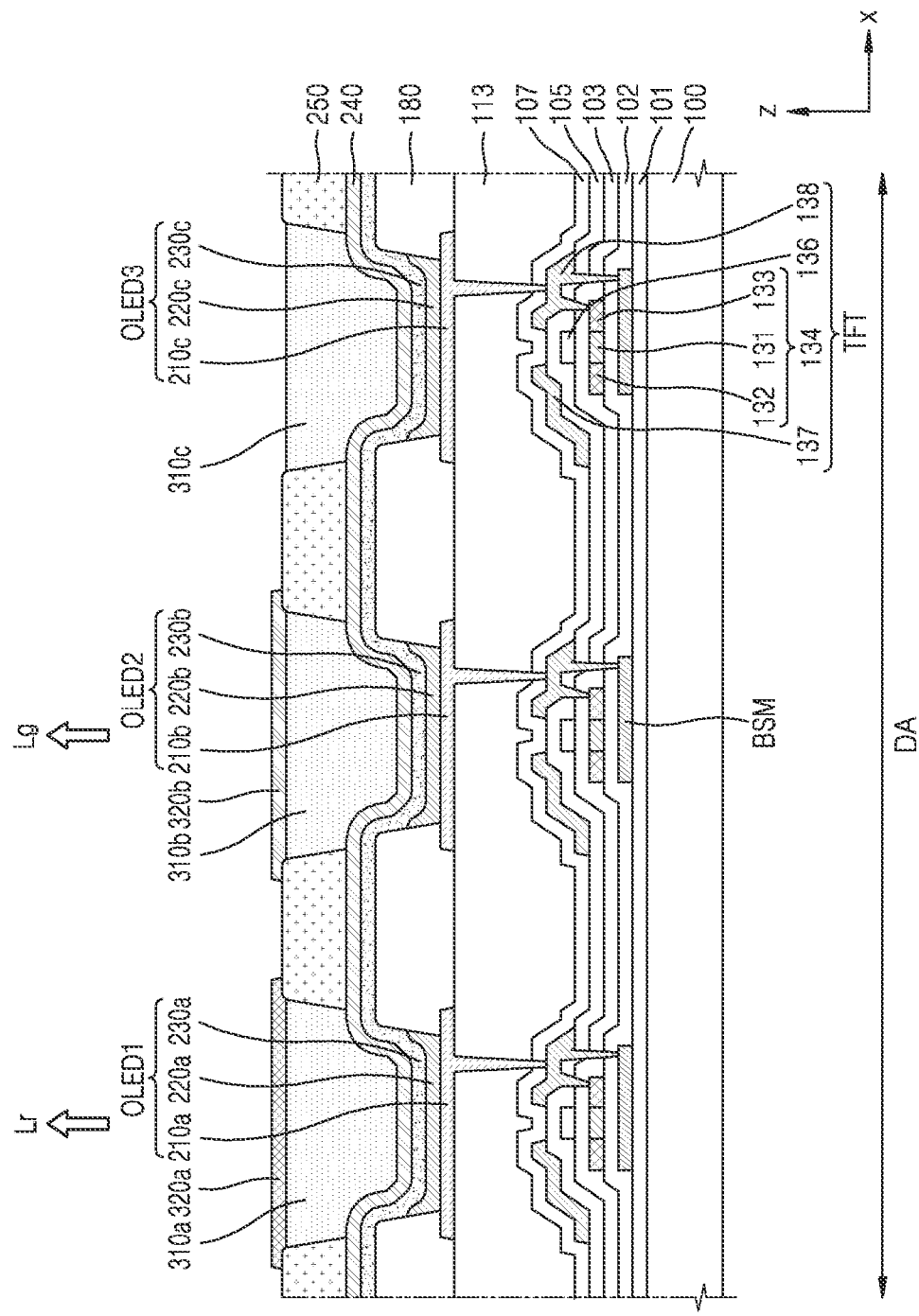

Referring to FIG. 7E, after the forming of the first color conversion layer 310a, the second color conversion layer 310b, and the third color conversion layer 310c, a first color filter 320a may be formed on the first color conversion layer 310a, the first color filter 320a selectively transmitting first light Lr; and a second color filter 320b may be formed on the second color conversion layer 310b, the second color filter 320b selectively transmitting second light Lg. The first color filter 320a may be arranged (or disposed) on the first color conversion layer 310a to selectively transmit the first light Lr generated by the first color conversion layer 310a, and the second color filter 320b may be arranged (or disposed) on the second color conversion layer 310b to selectively transmit the second light Lg generated by the second color conversion layer 310b.

Figure 7F:
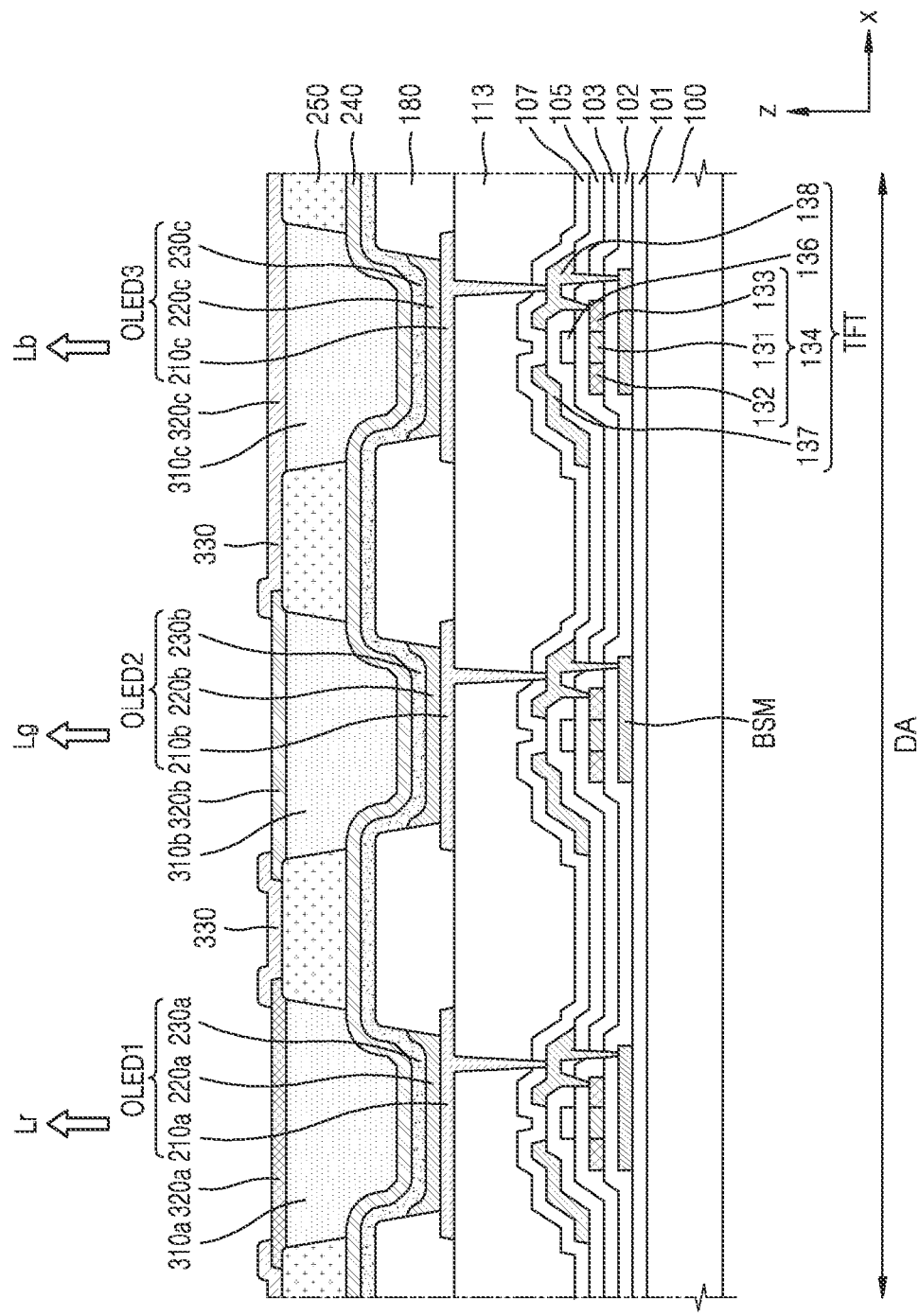

Referring to FIG. 7F, after the forming of the first color filter 320a and the second color filter 320b, a third color filter 320c may be formed on the third color conversion layer 310c, the third color filter 320c selectively transmitting third light Lb. The third color filter 320c may be arranged (or disposed) on the third color conversion layer 310c to selectively transmit the third light Lb generated by the third color conversion layer 310c. The third color conversion layer 310c may generate the third light Lb by scattering.

When the third color filter 320c is formed, a light blocking member 330 may be formed on the barrier 250. In an embodiment, the light blocking member 330 may be simultaneously formed with the third color filter 320c on the barrier 250. In an embodiment, a portion of the light blocking member 330 may also be formed on the first color filter 320a and the second color filter 320b. The light blocking member 330 may function as an auxiliary light shield such that light may not be emitted from a non-emission area. The light blocking member 330 may include the same material as the third color filter 320c. In an embodiment, the light blocking member 330 and the third color filter 320c may include a same material. In an embodiment, the light blocking member 330 may include a black matrix, a black pigment, a metal material, or the like.

Figure 7G:
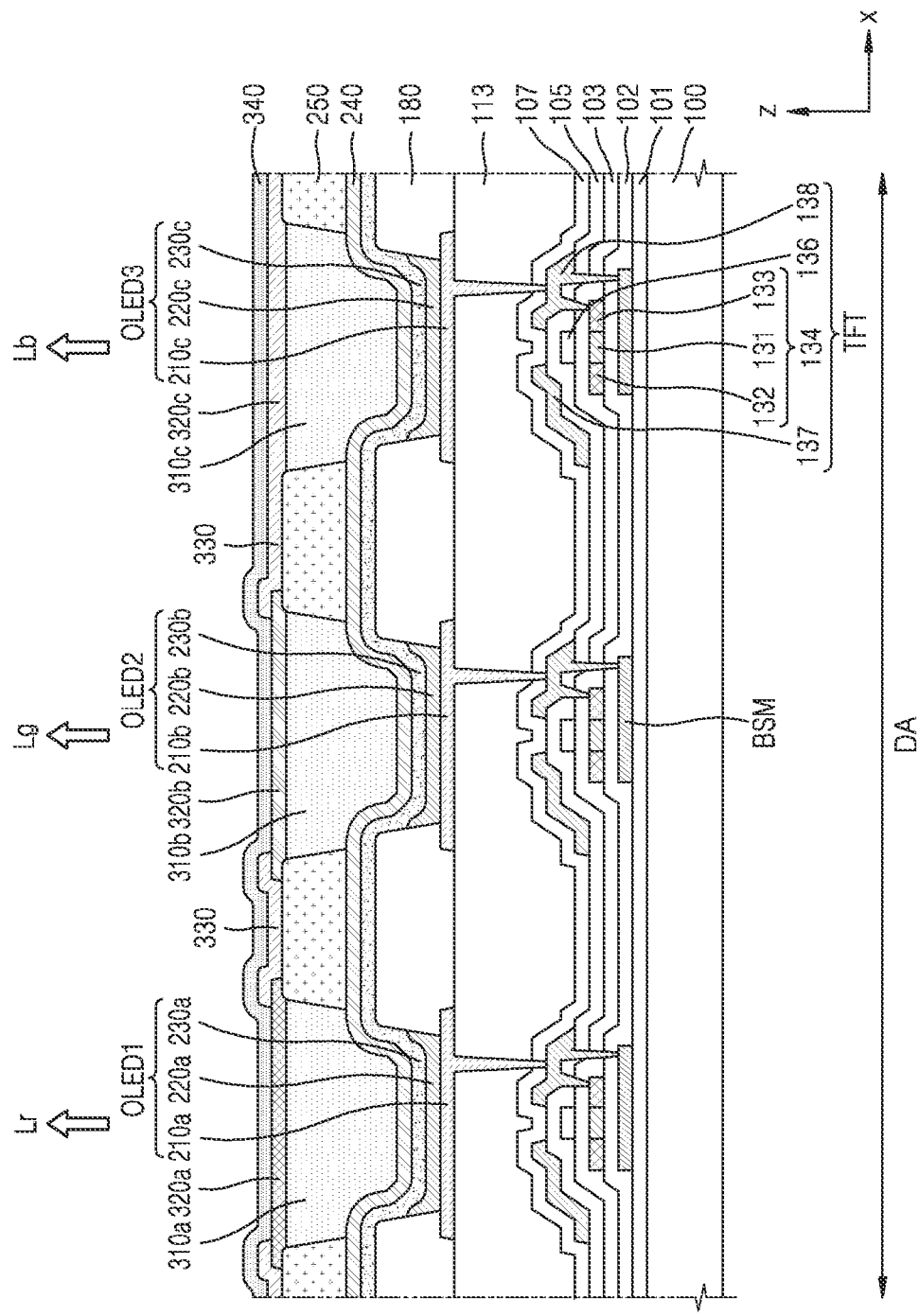

Referring to FIG. 7G, after the forming of the third color filter 320c, a second protection layer 340 may be formed on the first color filter 320a, the second color filter 320b, and the third color filter 320c. The second protection layer 340 may include an inorganic material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second protection layer 340 may include a single layer or multiple layers including the above inorganic material.

In an embodiment, because the first protection layer 240 including the inorganic material, the barrier 250 including the organic material, and the second protection layer 340 including the inorganic material are arranged (or disposed) on the first display device OLED1, the second display device OLED2, and the third display device OLED3, the first display device OLED1, the second display device OLED2, and the third display device OLED3 may be protected from external moisture and oxygen.

After the forming of the second protection layer 340, a thin film encapsulation layer including at least one inorganic encapsulation layer and at least one organic encapsulation layer may be formed on the second protection layer 340. In an embodiment, the thin film encapsulation layer may be directly formed on the second protection layer 340. The thin film encapsulation layer may cover the display area DA and extend to the outside of the display area DA. The thin film encapsulation layer may include at least one organic encapsulation layer and at least one inorganic encapsulation layer. For example, the thin film encapsulation layer may include a first inorganic encapsulation layer, an organic encapsulation layer, and a second inorganic encapsulation layer. In an embodiment, when the thin film encapsulation layer is directly arranged on the color filter, the second protection layer 340 may be used as the first inorganic encapsulation layer of the thin film encapsulation layer.

According to an embodiment, in order to solve the problem of a display apparatus of related art in which, when a first substrate where a display device is arranged and a second substrate where a color conversion layer is arranged are bonded through a bonding process, a failure occurs due to a misalignment or light efficiency decreases due to a filler arranged between the first substrate and the second substrate, by arranging a display device and a color conversion layer to be adjacent to each other while sequentially arranging the display device and the color conversion layer on one substrate, it may be possible to provide a display apparatus with improved light efficiency and color reproducibility.

As described above, according to an embodiment, a display apparatus with improved light efficiency may be implemented by arranging a display device and a color conversion layer to be adjacent to each other. However, the scope of the disclosure is not limited to these effects.

Embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the claims.

What is claimed is:

1. A display apparatus comprising:
   a substrate including a display area and a non-display area disposed adjacent to the display area;
   a first display device disposed on the substrate;
   a second display device disposed on the substrate;
   a first protection layer disposed on the first display device and the second display device;
   a first color conversion layer disposed on the first protection layer corresponding to the first display device and including first quantum dots converting incident light into first light;
   a second color conversion layer disposed on the first protection layer corresponding to the second display device and including second quantum dots converting incident light into second light; a barrier disposed between the first color conversion layer and the second color conversion layer;
   a first color filter disposed on the first color conversion layer and selectively transmitting the first light;
   a second color filter disposed on the second color conversion layer and selectively transmitting the second light;
   a light blocking member disposed on the barrier;
   a second protection layer disposed on the first color filter and the second color filter; and
   a thin film encapsulation layer disposed on the second protection layer, wherein
   at least a portion of the light blocking member is disposed directly over at least one of a portion of the first color filter and a portion of the second color filter.

2. The display apparatus of claim 1, further comprising:
   a third color conversion layer disposed on the first protection layer corresponding to a third display device disposed on the substrate, the third color conversion layer including light scattering particles converting incident light into third light by scattering the incident light; and
   a third color filter disposed on the third color conversion layer and selectively transmitting the third light.

3. The display apparatus of claim 2, wherein the light blocking member and the third color filter include a same material.

4. The display apparatus of claim 1, wherein the thin film encapsulation layer is directly disposed on the second protection layer.

5. The display apparatus of claim 1, wherein the thin film encapsulation layer includes at least one inorganic encapsulation layer and at least one organic encapsulation layer.

6. The display apparatus of claim 1, wherein the first color conversion layer, and the second color conversion layer are directly disposed on the first protection layer.

7. The display apparatus of claim 1, wherein the first protection layer includes an inorganic material.

8. The display apparatus of claim 1, wherein the barrier includes an organic material.

9. The display apparatus of claim 1, wherein the second protection layer includes an inorganic material.

10. The display apparatus of claim 1, wherein the first display device and the second display device each emit blue light.

11. The display apparatus of claim 1, further comprising:
    a first dam portion disposed on the non-display area adjacent to a periphery of the display area; and
    a second dam portion spaced apart from the first dam portion and disposed adjacent to the periphery of the display area.

12. The display apparatus of claim 1, wherein at least a portion of the light blocking member is disposed directly over both a portion the first color filter and a portion of the second color filter.

13. The display apparatus of claim 1, wherein the light blocking member includes a different material than the barrier.

* * * * *